US010520835B2

(12) United States Patent
Van Benten

(10) Patent No.: US 10,520,835 B2
(45) Date of Patent: Dec. 31, 2019

(54) MEASUREMENT SYSTEM, CALIBRATION METHOD, LITHOGRAPHIC APPARATUS AND POSITIONER

(71) Applicant: ASML Netherlands B.V., Veldhoven (NL)

(72) Inventor: Johannes Maria Van Benten, Heeze (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/096,520

(22) PCT Filed: Apr. 4, 2017

(86) PCT No.: PCT/EP2017/057927
§ 371 (c)(1),
(2) Date: Oct. 25, 2018

(87) PCT Pub. No.: WO2017/186458
PCT Pub. Date: Nov. 2, 2017

(65) Prior Publication Data
US 2019/0129314 A1  May 2, 2019

(30) Foreign Application Priority Data

Apr. 26, 2016  (EP) .................................. 16167055

(51) Int. Cl.
G03B 27/58  (2006.01)
G03F 7/20  (2006.01)
G03F 9/00  (2006.01)

(52) U.S. Cl.
CPC ............ *G03F 7/7085* (2013.01); *G03F 7/706* (2013.01); *G03F 7/70516* (2013.01);
(Continued)

(58) Field of Classification Search
CPC ............. G03F 7/70516; G03F 7/70558; G03F 7/70591; G03F 7/706; G03F 7/70616;
(Continued)

(56) References Cited

U.S. PATENT DOCUMENTS 5,477,057 A    12/1995  Angeley et al.
5,515,470 A     5/1996  Eikelmann et al.
(Continued)

FOREIGN PATENT DOCUMENTS

DE    43 18 140 A1    12/1994
EP     1 111 473 A2     6/2001
(Continued)

OTHER PUBLICATIONS

International Search Report directed to related International Patent Application No. PCT/EP2017/057927, dated Jul. 20, 2017; 3 pages.
(Continued)

*Primary Examiner* — Christina A Riddle
(74) *Attorney, Agent, or Firm* — Sterne, Kessler, Goldstein & Fox, P.L.L.C.

(57) ABSTRACT

The invention relates to a measurement system for a projection system of a lithographic apparatus, comprising: —a sensor plate; —a detector comprising an array of detector areas; —a randomly ordered optical fiber bundle; —a positioner to position the sensor plate in the projection system; and —a control unit to control the positioning of the sensor plate and to obtain measurement data from an output of the detector, wherein a first free end of the optical fiber bundle is arranged to receive light from the sensor plate, wherein a second free end of the optical fiber bundle opposite the first free end of the optical fiber bundle is aligned with the array of detector areas of the detector, and wherein the control unit is configured to match each detector area with a corresponding location in a pupil plane of the projection system by
(Continued)

collecting measurement data corresponding to different positions of the sensor plate relative to the projection system.

15 Claims, 2 Drawing Sheets

(52) U.S. Cl.
CPC ...... *G03F 7/70716* (2013.01); *G03F 7/70725* (2013.01); *G03F 7/70758* (2013.01); *G03F 7/70775* (2013.01); *G03F 7/70875* (2013.01); *G03F 9/7088* (2013.01)

(58) Field of Classification Search
CPC ............. G03F 7/70716; G03F 7/70725; G03F 7/70758; G03F 7/70775; G03F 7/70825; G03F 7/707; G03F 7/7085; G03F 7/70866; G03F 7/70875; G03F 7/70891; G03F 7/709
USPC ............ 355/30, 52, 53, 55, 67–74, 77; 250/492.1, 492.2, 492.22, 493.1; 356/73.1, 614, 615, 399–401, 432, 213, 356/214, 215, 247
See application file for complete search history.

(56) References Cited

U.S. PATENT DOCUMENTS

| | | | |
|---|---|---|---|
| 6,151,102 A * | 11/2000 | Nishi | G03F 7/70358 250/584 |
| 8,773,635 B2 | 7/2014 | Shibazaki | |
| 2001/0006413 A1 * | 7/2001 | Burghoorn | G03F 9/7049 355/53 |
| 2002/0041377 A1 | 4/2002 | Hagiwara et al. | |
| 2005/0213097 A1 * | 9/2005 | Baselmans | G03F 7/706 356/399 |
| 2009/0155026 A1 | 6/2009 | Alberti et al. | |
| 2009/0284723 A1 * | 11/2009 | Shibazaki | G01B 11/03 355/53 |
| 2009/0290139 A1 | 11/2009 | Van Der Sijs et al. | |
| 2011/0063592 A1 | 3/2011 | Ezura et al. | |
| 2011/0317141 A1 * | 12/2011 | Kuiper | G03F 7/70716 355/67 |
| 2013/0050674 A1 * | 2/2013 | Prosyentsov | G03F 9/7015 355/72 |

FOREIGN PATENT DOCUMENTS

| | | |
|---|---|---|
| JP | 2010-206047 A | 9/2010 |
| JP | 2011-082474 A | 4/2011 |
| JP | 2014-126786 A | 7/2014 |
| WO | WO 2009/113544 A1 | 7/2011 |

OTHER PUBLICATIONS

International Preliminary Report and Patentability and Written Opinion of the International Searching Authority directed to related International Patent Application No. PCT/EP2017/057927, dated Oct. 30, 2018; 9 pages.

Japanese Notice of Reasons for Refusal with English-language translation attached directed to related Japanese Patent Application No. 2018-555543, dated Oct. 29, 2019; 12 pages.

* cited by examiner

MEASUREMENT SYSTEM, CALIBRATION METHOD, LITHOGRAPHIC APPARATUS AND POSITIONER

CROSS REFERENCE TO RELATED APPLICATIONS

This application claims priority of EP application 16167055.9 which was filed on 2016 Apr. 26 and which is incorporated herein in its entirety by reference.

BACKGROUND

Field of the Invention

The present invention relates to a measurement system, a calibration method for such a measurement system, a lithographic apparatus comprising such a measurement system, a positioner for positioning a substrate table of a lithographic apparatus, and a lithographic apparatus comprising such a positioner.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to accurately transfer patterns to target portions of the substrate, the lithographic apparatus comprises measurement systems to measure different parameters associated with the transfer of the pattern, wherein the output of the measurement systems can be used to compensate for errors and deviations to improve the accuracy of the lithographic apparatus.

Examples of measured parameters are the aberration of the projection system of the lithographic apparatus and the position of the patterned radiation beam relative to the substrate. Some of the measurement systems are provided on the positioner configured to position the substrate relative to the projection system. When the positioner comprises a long-stroke module for coarse positioning of the substrate table and a short-stroke module for fine positioning the substrate table, the measurement systems are usually provided on the short-stroke module.

A disadvantage thereof is that the measurement systems generate heat close to the substrate at a location which cannot easily be cooled. This may result in thermal drift, bad stability and/or a low signal-to-noise level, and may even affect the position accuracy of the short-stroke module or undesirably heat up the substrate when power dissipation increases, e.g. as a result of extension to more channels and digital signal processing.

SUMMARY

It is desirable to provide an improved measurement system with reduced heating problems.

According to an aspect of the invention, there is provided a measurement system for a projection system of a lithographic apparatus, wherein the projection system is configured to project a patterned radiation beam, said measurement system comprising:
  a sensor plate;
  a detector comprising an array of detector areas;
  a randomly ordered optical fiber bundle;
  a positioner to position the sensor plate in the patterned radiation beam projected by the projection system; and
  a control unit to control the positioning of the sensor plate and to obtain measurement data from an output of the detector,
wherein a first free end of the optical fiber bundle is arranged to receive light from the sensor plate, wherein a second free end of the optical fiber bundle opposite the first free end of the optical fiber bundle is arranged such that light emanating from fibers of the optical fiber bundle at the second free end illuminates the detector, wherein each fiber illuminates a different detector area of the detector,
and wherein the control unit is configured to match each detector area with a corresponding location in a pupil plane of the projection system by collecting measurement data corresponding to different positions of the sensor plate relative to the projection system.

According to an embodiment of the invention, there is provided a calibration method comprising the following steps:
a) providing a lithographic apparatus comprising a projection system and a measurement system according to claim 1;
b) positioning the sensor plate in different positions relative to the projection system;
c) collecting measurement data corresponding to the different positions; and
d) matching each detector are of the detector with a corresponding location in a pupil plane of the projection system using the collected measurement data.

According to a further embodiment of the invention, there is provided a lithographic apparatus comprising:
  an illumination system configured to condition a radiation beam;
  a support constructed to support a patterning device, the patterning device being capable of imparting the radiation beam with a pattern in its cross-section to form a patterned radiation beam;
  a substrate table constructed to hold a substrate with a multiple target portions arranged in one or more columns parallel to an axis;
  a projection system configured to project the patterned radiation beam onto a target portion of the substrate; and
  a measurement system according to the invention.

According to another aspect of the invention, there is provided a positioner for a substrate table of a lithographic apparatus, comprising:
  a long-stroke module for coarse positioning of the substrate table relative to a reference;

a short-stroke module supported by the long-stroke module for fine positioning of the substrate table relative to the reference;
a sensor plate arranged on the short-stroke module;
a detector arranged on the long-stroke module;
an optical fiber bundle arranged on the long-stroke module, wherein a cross-section of a fiber in the optical fiber bundle has an outer diameter; and
a control unit configured to control the long-stroke module and the short-stroke module to position the substrate table relative to the reference,
wherein a first free end of the optical fiber bundle is arranged to receive light from the sensor plate,
wherein a second free end of the optical fiber bundle opposite the first free end of the optical fiber bundle is arranged such that light emanating from the fibers of the optical fiber bundle at the second free end illuminates the detector,
and wherein the control unit is configured to keep a moving range of the short-stroke module relative to the long-stroke module within at most half the outer diameter of the cross-section of the optical fibers during at least a predetermined measurement period.

According to another embodiment of the invention, there is provided a lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate with a multiple target portions arranged in one or more columns parallel to an axis;
a projection system configured to project the patterned radiation beam onto a target portion of the substrate; and
a positioner according to the invention to position the substrate table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
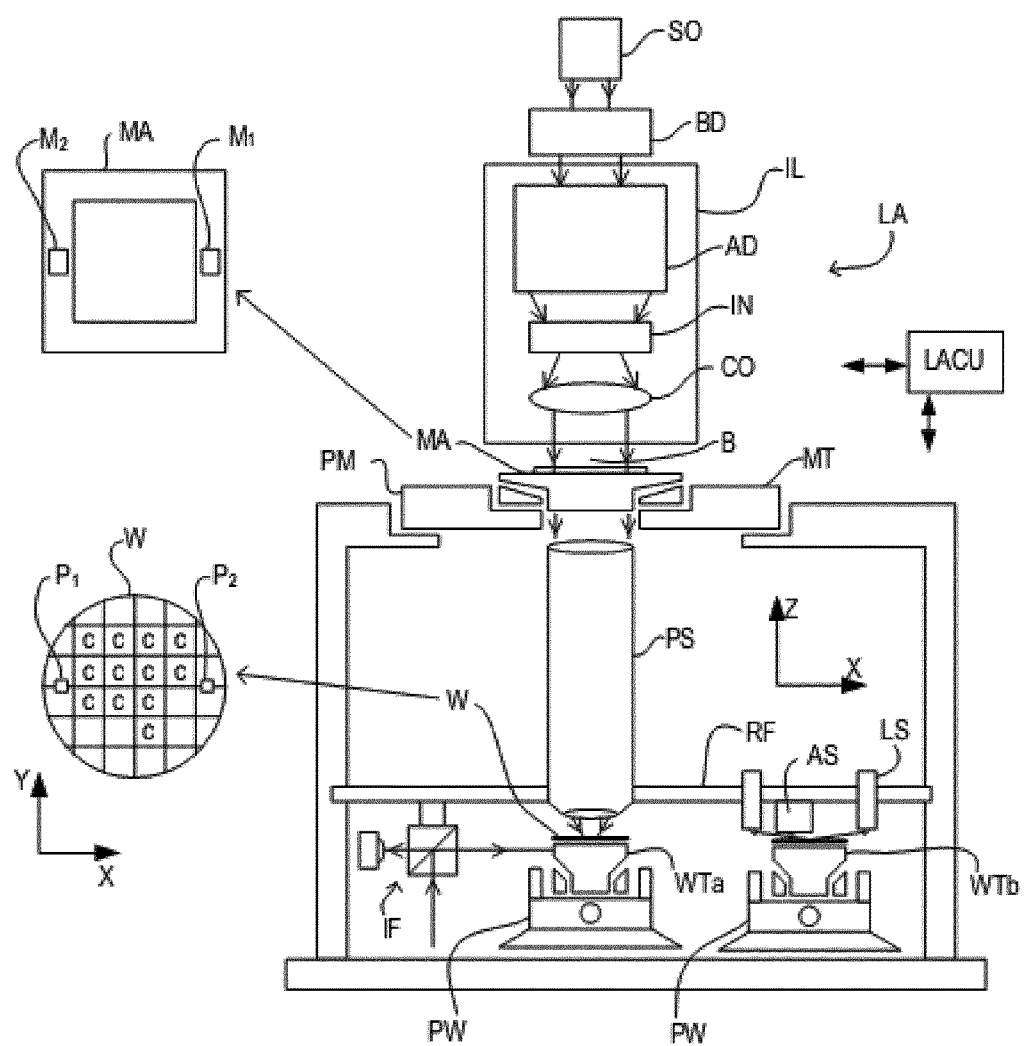
FIG. 1 depicts a lithographic apparatus according to an embodiment of the invention.

FIG. 1 schematically depicts a lithographic apparatus according to one embodiment of the invention. The apparatus comprises:
an illumination system (illuminator) IL configured to condition a radiation beam B (e.g. UV radiation or EUV radiation).
a support structure (e.g. a mask table) MT constructed to support a patterning device (e.g. a mask) MA and connected to a first positioner PM configured to accurately position the patterning device in accordance with certain parameters;
a substrate table (e.g. a wafer table) WTa or WTb constructed to hold a substrate (e.g. a resist-coated wafer) W and connected to a second positioner PW configured to accurately position the substrate in accordance with certain parameters; and
a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, and/or controlling radiation.

The support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate W. It should be noted that the pattern imparted to the radiation beam may not exactly correspond to the desired pattern in the target portion of the substrate W, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask).

Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS.

Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illuminator IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam is passed from the radiation source SO to the illuminator IL with the aid of a beam delivery system BD comprising, for example, suitable directing mirrors and/or a beam expander. In other cases the source may be an integral part of the lithographic apparatus, for example when the source is a mercury lamp. The radiation source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks M1, M2 may be located between the dies.

The depicted apparatus can at least be used in scan mode, in which the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de)-magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In addition to the scan mode, the depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
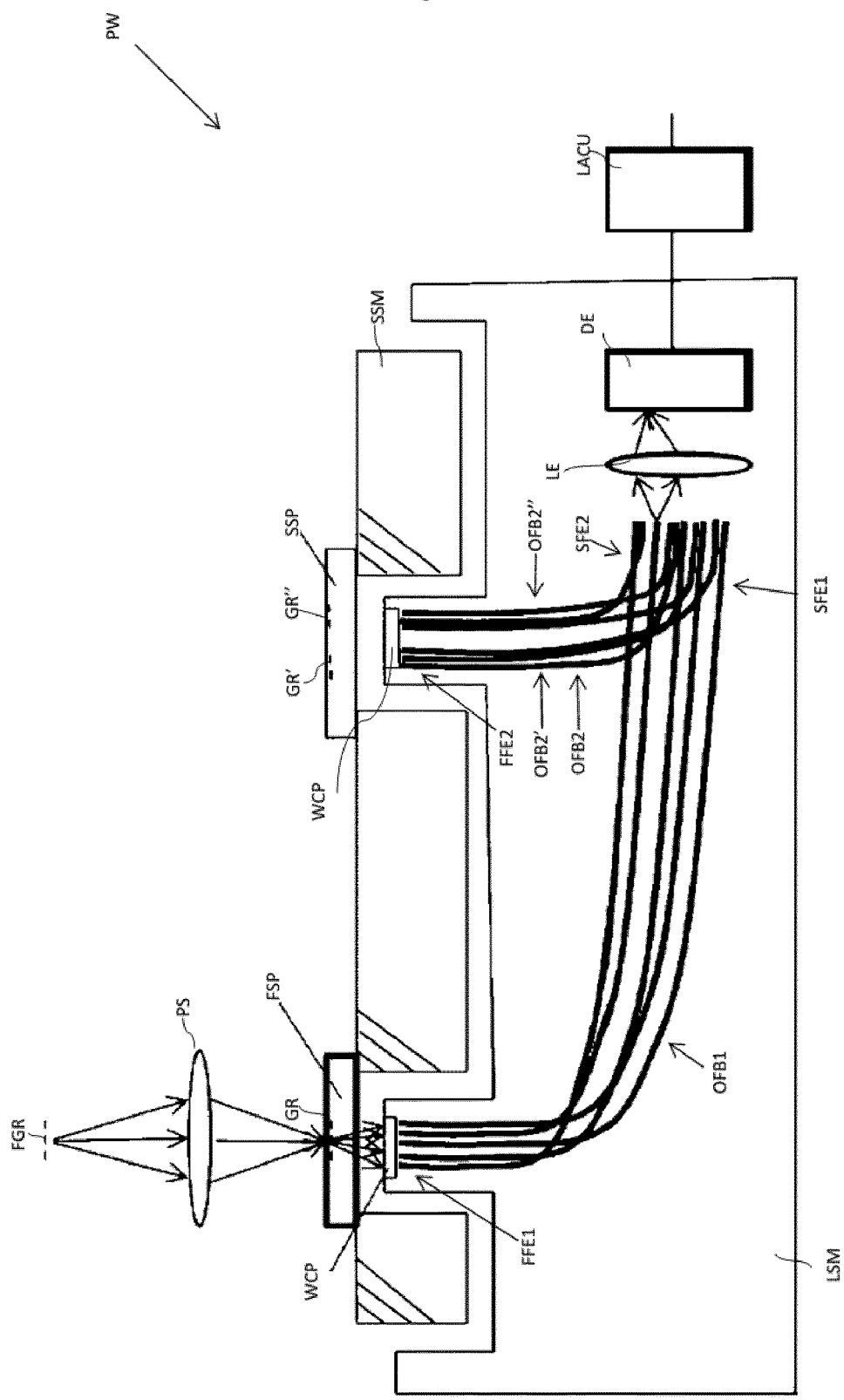
FIG. 2 depicts the second positioner of the lithographic apparatus of FIG. 1 in more detail.

FIG. 2 depicts the second positioner PW in more detail, including a long-stroke module LSM for coarse positioning the substrate table WT (not shown in FIG. 2, but visible in FIG. 1) relative to a reference, e.g. the projection system PS or a metrology frame, and a short-stroke module SSM supported by the long-stroke module LSM for fine positioning of the substrate table WT relative to the reference.

For simplicity reasons, the projection system PS in FIG. 2 is simply indicated by a single projection lens, but it will be clear to the skilled person that the projection system PS in practice may comprise multiple optical elements including lenses and mirrors.

The positioner PW further comprises a measurement system which, for instance, allows to measure a position of the short-stroke module SSM relative to a patterned radiation beam projected via the projection system PS and/or allows to measure aberrations of the projection system PS.

The measurement system comprises a first sensor plate FSP and a second sensor plate SSP both arranged on the short-stroke module SSM. The first and second sensor plates FSP, SSP manipulate light from the projection system PS, e.g. using one or more gratings GR, GR', GR" such that a detectable optical signal is obtained that can be passed on to a detector DE. The sensor plates FSP, SSP may also comprise one or more pinholes, slits or other optical manipulating objects. Light may be transmitted by the sensor plates, e.g. using a transmissive grating, or may be reflected by the sensor plates, e.g. using a reflective grating.

Light coming from the first sensor plate FSP, in this case light transmitted by the sensor plate, is received by a first optical fiber bundle OFB1 at a first free end FFE1 thereof, in this case a randomly ordered optical fiber bundle. The first optical fiber bundle OFB1 is arranged on the long-stroke module LSM. Due to the fact that the first sensor plate FSP is arranged on the short-stroke module and the first optical fiber bundle OFB1 is arranged on the long-stroke module LSM, light passes from the short-stroke module SSM to the long-stroke module LSM, where there may be a gap in between the short-stroke module SSM and the long-stroke module LSM.

A second free end SFE1 of the first optical fiber bundle OFB1 is aligned with the detector DE, i.e. the second free end SFE1 of the first optical fiber bundle OFB1 is arranged such that light emanating from fibers of the first optical fiber bundle OFB1 at the second free end SFE1 illuminate the detector DE.

The detector DE comprises an array of detector areas, for instance an array of photodiodes. The detector areas may alternatively be referred to as pixels, and the detector may alternatively be referred to as camera. The fibers of the first optical fiber bundle OFB1 are aligned with the detector areas, wherein the alignment does not necessarily have to be such that each detector area has only one associated fiber. Alternatively, each detector area may have more than one associated fiber or each fiber may have more than one associated detector area. However, the first optical fiber bundles comprises at least two, preferably at least ten and more preferably at least twenty five fibers, and the detector comprises at least two, preferably at least ten and more preferably at least twenty five detector areas to be associated with the fibers of the first optical fiber bundle.

An optical element, such as a lens LE may be used to project the light emanating from the first optical fiber bundle OFB1 on the detector DE.

The detector DE is arranged on the long-stroke module LSM at a distance from the short-stroke module SSM. Arranging the detector DE on the long-stroke module LSM and connecting the detector DE to the sensor plate via the first optical fiber bundle OFB1 has the advantage that the detector and electronics associated with the detector DE are at a distance from the short-stroke module, so that heating problems are less likely to occur or can easily be compensated for as there is space available for cooling equipment.

A control unit, here the control unit LACU, is configured to control the positioning of the sensor plates by driving the short-stroke module and the long-stroke module, and to obtain measurement data from an output of the detector DE. In FIG. 2, the control unit has positioned the first sensor plate FSP below the projection system PS.

As for most measurements it may be desired to know which detector area of the detector DE receives light from which part of a pupil plane of the projection system, but in case a randomly ordered first optical fiber bundle OFB1 is used, the control unit is configured to match each detector area with a corresponding location in a pupil plane of the projection system, e.g. in an exit pupil plane of the projection system. This can be done by collecting measurement data belonging to different positions of the first sensor plate relative to the projections system.

In an embodiment, such calibration is carried out by positioning the sensor plate in different positions relative to the projection system, collecting measurement data corresponding to the different position, and matching each detector area of the detector with a corresponding location in a pupil plane of the projection system using the collected measurement data.

In an embodiment, positioning the sensor plate in different positions includes positioning the sensor plate at planes displaced along an optical axis relative to each other.

In an embodiment, collecting measurement data includes projecting a test pattern in the lithographic apparatus, wherein projecting is performed multiple times to obtain a plurality of images corresponding to the planes displaced along the optical axis relative to each other.

In an embodiment, matching each detector area of the detector with a corresponding location in the pupil plane of the projection system comprises calculating, for the plurality of images, a rate of change of displacement of portions of the test pattern with respect to displacement along the optical axis, and calculating a location in the pupil plane of the projection system traversed by radiation for particular portions of the test pattern using the calculated rate of change.

Using a randomly ordered optical fiber bundle is much cheaper and easier to install and maintain than using an ordered optical fiber bundle.

It may further be desirable during a predetermined measurement period to observe the same part of the pupil plane, so that the control unit may further be configured to keep a moving range of the short-stroke module relative to the long-stroke module within at most half an outer diameter of the cross-section of the optical fibers during at least the predetermined measurement period. This has the advantage that there is no mechanical coupling between the short-stroke-module and the long-stroke module as a result of the measurement system thereby improving the accuracy of the positioner.

In an embodiment, the moving range is limited to at most half a diameter of the optical core of the optical fibers, preferably to at most 10 micrometer, more preferably to at most 5 micrometer.

In this embodiment, light coming from the second sensor plate SSP is received by a second optical fiber bundle OFB2 at a first free end FFE2 thereof, in this case a randomly ordered optical fiber bundle. The second optical fiber bundle OFB2 is also arranged on the long-stroke module LSM, so that a similar transition from the second sensor plate SSP on the short-stroke module to the second optical fiber bundle OFB2 is obtained as for the first sensor plate FSP and the first optical fiber bundle OFB1.

A second free end SFE2 of the second optical fiber bundle OFB2 is aligned with the same detector DE as the second free end SFE2 of the first optical fiber bundle. However, this does not necessarily have to be the case and many configurations are possible.

In a first embodiment, the optical fibers of the first optical fiber bundle are aligned with the same set of detector areas as the optical fibers of the second optical fiber bundle, so that each detector area is aligned with one or more optical fibers of the first optical fiber bundle and at the same time also aligned with one or more optical fibers of the second optical fiber bundle, meaning that only one of the sensor plates can be illuminated at the same time by the projection system to be able to distinguish between light coming from the first sensor plate and the second sensor plate.

In a second embodiment, the optical fibers of the first optical fiber bundle are aligned with a first set of detector areas and the optical fibers of the second optical fiber bundle are aligned with a second set of detector areas different from the first set of detector areas, allowing to use the first and second sensor plates simultaneously.

In a third embodiment, the first and second optical fiber bundle are aligned similarly as in the second embodiment, but with the difference that the first set of detector areas belongs to a first detector and the second set of detector areas belongs to a second detector different from the first detector, where in the second embodiment described above the first and second set of detector areas belong to the same detector. In a fourth embodiment, at least two separate detectors are used, wherein each detector is aligned with a part of the first and second optical fiber bundle, which alignment can be similar to the first embodiment in which optical fibers of the first and second optical fiber bundle share detector areas or can be similar to the second or third embodiment in which detector areas are not shared by optical fibers of the first and second optical fiber bundle. The fourth embodiment, in which multiple detectors are used by splitting up the optical fiber bundle in multiple sub-bundles, has the advantage that parallel read-out of multiple small detectors and parallel signal processing can be used to increase the throughput of the lithographic apparatus as measurement periods are reduced.

Where the first sensor plate FSP indicates the presence of only a single grating GR, the second sensor plate SSP comprises a first grating GR' and a second grating GR". The second optical fiber bundle comprises a part OFB2' and another part OFB2" for respectively the first and second grating GR' and GR". These parts OFB2' and OFB2" may alternatively be considered separate optical fiber bundles and do not necessarily have to be aligned with the same detector DE.

The first grating GR' may for instance be a grating with lines in a first direction, e.g. an X-direction, and the second grating GR" may for instance be a grating with lines in a second direction perpendicular to the first direction, e.g. a Y-direction, so that one is able to discern between images from both the first and second grating by scanning or stepping in two different directions. It may further be possible to discern between gratings by only illuminating one at a time.

In an embodiment, the first and/or second sensor plate is used for wave front measurements. The measurement system may further comprise a further sensor plate including for instance a grating FGR, which further sensor plate may be arranged on a patterning device MA (see FIG. 1) or the patterning device support MT (see also FIG. 1).

In FIG. 2, the first free ends FFE1, FFE2 of the first and second optical fiber bundle are coupled to a respective corresponding wavelength conversion plate WCP allowing to convert the light coming from the respective sensor plate into light with a suitable wavelength range that can both be transmitted by the optical fibers of the first and second optical fiber bundle and can be detected by the detector areas of the detector. In case the light coming from the respective sensor plate already comprises suitable properties, such wavelength conversion plate may be omitted.

In FIG. 2, the wavelength conversion plates WCP are arranged on the long-stroke module, but alternatively, they could also be arranged on the short-stroke module. However, in case of the latter, the wavelength conversion plate is preferably imaged onto fiber ends of the first or second optical fiber bundle by means of a lens for optimal in coupling of light. This lens may be arranged on the short-stroke module but may also be arranged on the long-stroke module.

Also when the wavelength conversion plate is arranged on the long-stroke module, a lens may be used to image the wavelength conversion plate onto the fiber ends. Alternatively, the wavelength conversion plate is directly attached, e.g. by glue, to the fibers as depicted in FIG. 2.

It is noted that the term "consecutive" or "consecutively" in this context means that no other exposures or irradiation of target portions takes place in between the respective steps. However, it does not exclude other operations to be performed in between the respective steps, such as measurement steps, calibration steps, positioning steps, etc.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A measurement system for a projection system of a lithographic apparatus, wherein the projection system is configured to project a patterned radiation beam, the measurement system comprising:
    a sensor plate arranged on a short-stroke module configured for fine positioning of a substrate table of the lithographic apparatus relative to a reference;
    a detector comprising an array of detector areas, wherein the detector is arranged on a long-stroke module configured for coarse positioning of the substrate table relative to the reference;
    a randomly ordered optical fiber bundle arranged on the long-stroke module;
    a positioner configured to position the sensor plate in the patterned radiation beam projected by the projection system; and
    a control unit configured to control the positioning of the sensor plate and to obtain measurement data from an output of the detector,
    wherein a first free end of the optical fiber bundle is arranged to receive light from the sensor plate,
    wherein a second free end of the optical fiber bundle opposite the first free end of the optical fiber bundle is arranged such that light emanating from fibers of the optical fiber bundle at the second free end illuminates the detector, wherein each fiber illuminates a different detector area of the detector, and
    wherein the control unit is configured to match each detector area with a corresponding location in a pupil plane of the projection system by collecting measurement data corresponding to different positions of the sensor plate relative to the projection system.

2. The measurement system of claim 1, further comprising:
    a wavelength conversion plate arranged in between the sensor plate and the first free end of the optical fiber bundle and configured to convert a wavelength range of light from the sensor plate into a different wavelength range that can be handled by both the optical fiber bundle and the detector.

3. The measurement system of claim 1, further comprising:
    a further sensor plate configured to be arranged on an opposite side of the projection system in order to be imaged onto the sensor plate by the projection system.

4. The measurement system of claim 1, further comprising:
    a second sensor plate and a randomly ordered second optical fiber bundle,
    wherein a first free end of the second optical fiber bundle is arranged to receive light from the second sensor plate, and
    wherein a second free end of the second optical fiber bundle opposite the first free end of the second optical fiber bundle is arranged such that light emanating from fibers of the second optical fiber bundle at the second free end illuminates the detector, wherein each fiber illuminates a different detector area of the detector.

5. The measurement system of claim 1, wherein the sensor plate comprises one or more gratings.

6. A calibration method comprising:
    positioning a sensor plate in different positions relative to a projection system, such that a first free end of an optical fiber bundle is arranged to receive light from the sensor plate,
    wherein a second free end of the optical fiber bundle opposite the first free end of the optical fiber bundle is arranged such that light emanating from fibers of the optical fiber bundle at the second free end illuminates a detector,
    wherein each fiber illuminates a different detector area of the detector,
    wherein a control unit is configured to match each detector area with a corresponding location in a pupil plane of the projection system by collecting measurement data corresponding to different positions of the sensor plate relative to the projection system, and
    wherein the sensor plate is arranged on a short-stroke module configured for fine positioning of a substrate table relative to a reference, the detector is arranged on a long-stroke module configured for coarse positioning of the substrate table relative to the reference, and the optical fiber bundle is arranged on the long-stroke module;
collecting measurement data corresponding to the different positions; and
matching each detector area of the detector with a corresponding location in a pupil plane of the projection system using the collected measurement data.

7. The method of claim 6, wherein:
the positioning the sensor plate in different positions includes positioning the sensor plate at planes displaced along an optical axis relative to each other,
the collecting measurement data includes projecting a test pattern in the lithographic apparatus,
the projecting is performed multiple times to obtain a plurality of images corresponding to the planes displaced along the optical axis relative to each other, and
the matching each detector area of the detector with a corresponding location in the pupil plane of the projection system comprises calculating, for the plurality of images, a rate of change of displacement of portions of the test pattern with respect to displacement along the optical axis, and calculating a location in the pupil plane of the projection system traversed by radiation for particular portions of the test pattern using the calculated rate of change.

8. The method of claim 6, wherein the collecting measurement data corresponding to the different positions comprises providing a further sensor plate at an opposite side of the projection system, illuminating the further sensor plate with a radiation beam, and projecting an image of the further sensor plate onto the sensor plate of the measurement system by the projection system.

9. A lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate with multiple target portions arranged in one or more columns parallel to an axis;
a projection system configured to project the patterned radiation beam onto a target portion of the substrate; and
a measurement system comprising:
  a sensor plate arranged on a short-stroke module configured for fine positioning of the substrate table relative to a reference;
  a detector comprising an array of detector areas, wherein the detector is arranged on a long-stroke module configured for coarse positioning of the substrate table relative to the reference;
  a randomly ordered optical fiber bundle arranged on the long-stroke module;
  a positioner configured to position the sensor plate in the patterned radiation beam projected by the projection system; and
  a control unit configured to control the positioning of the sensor plate and to obtain measurement data from an output of the detector,
    wherein a first free end of the optical fiber bundle is arranged to receive light from the sensor plate,
    wherein a second free end of the optical fiber bundle opposite the first free end of the optical fiber bundle is arranged such that light emanating from fibers of the optical fiber bundle at the second free end illuminates the detector, wherein each fiber illuminates a different detector area of the detector, and
    wherein the control unit is configured to match each detector area with a corresponding location in a pupil plane of the projection system by collecting measurement data corresponding to different positions of the sensor plate relative to the projection system.

10. The lithographic apparatus of claim 9, wherein the measurement system comprises a further sensor plate arranged on a patterning device or the support constructed to support the patterning device.

11. A positioner for a substrate table of a lithographic apparatus, comprising:
a long-stroke module configured for coarse positioning of the substrate table relative to a reference;
a short-stroke module supported by the long-stroke module configured for fine positioning of the substrate table relative to the reference;
a sensor plate arranged on the short-stroke module;
a detector arranged on the long-stroke module;
an optical fiber bundle arranged on the long-stroke module, wherein a cross-section of a fiber in the optical fiber bundle has an outer diameter; and
a control unit configured to control the long-stroke module and the short-stroke module to position the substrate table relative to the reference,
wherein a first free end of the optical fiber bundle is arranged to receive light from the sensor plate,
wherein a second free end of the optical fiber bundle opposite the first free end of the optical fiber bundle is arranged such that light emanating from the fibers of the optical fiber bundle at the second free end illuminates the detector, and
wherein the control unit is configured to keep a moving range of the short-stroke module relative to the long-stroke module within at most half the outer diameter of the cross-section of the optical fibers during at least a predetermined measurement period.

12. The positioner of claim 11, further comprising a wavelength conversion plate arranged in between the sensor plate and the first free end of the optical fiber bundle to convert a wavelength range of the light from the sensor plate into a different wavelength range that can be handled by both the optical fiber bundle and the detector.

13. The positioner of claim 11, wherein:
the optical fiber bundle is a randomly ordered optical fiber bundle, and
the control unit is configured to match each detector area with a corresponding location in a pupil plane of the projection system by collecting measurement data corresponding to different positions of the sensor plate relative to the projection system.

14. A lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate with multiple target portions arranged in one or more columns parallel to an axis;

a projection system configured to project the patterned radiation beam onto a target portion of the substrate; and a positioner configured to position the substrate table, the positioner comprising:
  a long-stroke module configured for coarse positioning of the substrate table relative to a reference;
  a short-stroke module supported by the long-stroke module configured for fine positioning of the substrate table relative to the reference;
  a sensor plate arranged on the short-stroke module;
  a detector arranged on the long-stroke module;
  an optical fiber bundle arranged on the long-stroke module, wherein a cross-section of a fiber in the optical fiber bundle has an outer diameter; and
  a control unit configured to control the long-stroke module and the short-stroke module to position the substrate table relative to the reference, wherein a first free end of the optical fiber bundle is arranged to receive light from the sensor plate, wherein a second free end of the optical fiber bundle opposite the first free end of the optical fiber bundle is arranged such that light emanating from the fibers of the optical fiber bundle at the second free end illuminates the detector, and wherein the control unit is configured to keep a moving range of the short-stroke module relative to the long-stroke module within at most half the outer diameter of the cross-section of the optical fibers during at least a predetermined measurement period.

15. The lithographic apparatus of claim 14, further comprising a further sensor plate arranged on a patterning device or the support constructed to support the patterning device.

* * * * *